United States Patent
Chinthu et al.

(10) Patent No.: US 12,470,218 B2
(45) Date of Patent: Nov. 11, 2025

(54) COMPACT HIGH VOLTAGE PRE-DRIVER AND CIRCUITS INCLUDING THE PRE-DRIVER

(71) Applicant: GlobalFoundries U.S. Inc., Malta, NY (US)

(72) Inventors: Siva Kumar Chinthu, Bangalore (IN); Suresh Pasupula, Anatapur (IN); Devesh Dwivedi, Bangalore (IN); Anoop Delampady, Kerala (IN)

(73) Assignee: GlobalFoundries U.S. Inc., Malta, NY (US)

( * ) Notice: Subject to any disclaimer, the term of this patent is extended or adjusted under 35 U.S.C. 154(b) by 41 days.

(21) Appl. No.: 18/585,187

(22) Filed: Feb. 23, 2024

(65) Prior Publication Data
US 2025/0274123 A1    Aug. 28, 2025

(51) Int. Cl.
*H03K 19/0185* (2006.01)
*H03K 17/687* (2006.01)

(52) U.S. Cl.
CPC . *H03K 19/018507* (2013.01); *H03K 17/6871* (2013.01)

(58) Field of Classification Search
CPC .............. H03K 19/018507; H03K 17/6871
See application file for complete search history.

(56) References Cited

U.S. PATENT DOCUMENTS

| | | | |
|---|---|---|---|
| 7,274,209 B1* | 9/2007 | Reinschmidt | H03K 3/356121 326/38 |
| 2022/0130344 A1* | 4/2022 | Li | G11C 11/418 |
| 2022/0329236 A1* | 10/2022 | Hsu | H03K 3/356086 |

OTHER PUBLICATIONS

Pan et al., "A Low Voltage to High Voltage Level Shifter Circuit for MEMS Application," In Proceedings of the 15th Biennial University/Government/Industry Microelectronics Symposium (Cat. No. 03CH37488), IEEE, downloaded from IEEE Xplore on Jan. 11, 2024, 4 pages.

Park et al., "A Novel Level-SHifter Circuit Design For Display Panel Driver," In 2006 49th IEEE International Midwest Symposium on Circuits and Systems (vol. 2, pp. 391-394), downloaded from IEEE Xplore on Jan. 11, 2024, 4 pages.

\* cited by examiner

*Primary Examiner* — Metasebia T Retebo
(74) *Attorney, Agent, or Firm* — David Cain; Hoffman Warnick LLC (57) ABSTRACT

A pre-driver includes first, second, third, and fourth P-channel field effect transistors (PFETs) with voltage ratings equal to a low first voltage (V1). Between power rails at V1 and at a higher second voltage (V2), the first and third PFETs are series-connected and the second and fourth PFETs are also series-connected. The third and fourth PFETs are cross-coupled. The first and second PFETs have gates that receive a pre-driver input signal (Pin) that switches between V2 and ground and an inverted pre-driver input signal (Pinb), respectively. At an output node between the first and third PFETs, the pre-driver outputs a driver input signal (Din) that switches between V2 and V1. A circuit includes this pre-driver (e.g., connected between a voltage level shifter and a driver or connected between a voltage level shifter and a buffer).

17 Claims, 8 Drawing Sheets

COMPACT HIGH VOLTAGE PRE-DRIVER AND CIRCUITS INCLUDING THE PRE-DRIVER

BACKGROUND

The present disclosure relates to pre-drivers and, more particularly, to embodiments of a compact high voltage pre-driver and to circuits that can include the compact high voltage pre-driver.

Memory structures typically include, among other components: an array of memory cells arranged in rows and columns; wordlines (WLs) for the rows; and wordline driver circuits for the WLs. A WL for a row is connected to all memory cells in that row and also connected to a wordline driver circuit. The wordline driver circuit receives a first wordline select signal (e.g., from a row address decoder) and outputs a second wordline select signal to the WL to provide access to selected memory cell(s) connected to the WL during read/write operations. In some memory structures, the first wordline select signal received by the wordline driver circuit may be a relatively low voltage wordline select signal (WLsel-lv) (e.g., for reduced power consumption). However, for improved performance during read/write operations, it may be advantageous for the second wordline select signal output to the WL itself to be a relatively high voltage wordline select signal (WLsel-hv). Therefore, multi-stage wordline driver circuits have been developed that provide low voltage to high voltage signal conversion. These multi-stage wordline driver circuits typically include three stages. A first stage (also referred to herein as a voltage level shifter) converts a received WLsel-lv, which switches between a relatively low positive first voltage (V1) and ground (GND), to a pre-driver input signal (Pin), which switches between a relatively high positive second voltage (V2) and GND. A second stage (also referred to herein as a pre-driver) converts Pin to a driver input signal (Din), which switches between V2 and V1. A third stage (also referred to herein as a driver) converts Din to WLsel-hv, which switches between V2 and GND and which is output to the WL. However, with such multi-stage wordline driver circuits, there are often undesirable trade-offs between area, power, and performance.

SUMMARY

Disclosed herein are embodiments of a pre-driver. The pre-driver can include a first input node and a second input node. The pre-driver can further include four transistors and, particularly, a first P-channel field effect transistor (PFET) with a first gate connected to the first input node, a second PFET with a second gate connected to the second input node, a third PFET, and a fourth PFET. The first PFET and the third PFET can be connected in series between a first power rail at a first voltage and a second power rail at a second voltage that is greater than (e.g., twice) the first voltage. The second PFET and the fourth PFET can also be connected in series between the first power rail and the second power rail. Furthermore, the third PFET and the fourth PFET can be cross-coupled. In this pre-driver the first input node can be connected to receive a pre-driver input signal that switches between the second voltage and ground and the second input node can be connected to receive an inverted pre-driver input signal. The pre-driver can also include an output node at a junction between the first PFET and the third PFET and the output node can output a pre-driver output signal that switches between the second voltage and the first voltage.

Also disclosed herein are embodiments of circuits that include such a pre-driver. For example, a disclosed circuit can include a voltage level shifter, which is connected to receive a voltage level shifter input signal that switches between a first voltage and ground. The voltage level shifter can further output a pre-driver input signal that switches between a second voltage that is greater than (e.g., twice) the first voltage and ground and an inverted pre-driver input signal. The circuit can further include a pre-driver. The pre-driver can include a first input node and a second input node. The pre-driver can further include four transistors and, particularly, a first P-channel field effect transistor (PFET) with a first gate connected to the first input node, a second PFET with a second gate connected to the second input node, a third PFET, and a fourth PFET. The first PFET and the third PFET can be connected in series between a first power rail at a first voltage and a second power rail at a second voltage that is greater than (e.g., twice) the first voltage. The second PFET and the fourth PFET can also be connected in series between the first power rail and the second power rail. Furthermore, the third PFET and the fourth PFET can be cross-coupled. In this pre-driver the first input node can be connected to receive the pre-driver input signal and the second input node can be connected to receive the inverted pre-driver input signal. The pre-driver can also include an output node at a junction between the first PFET and the third PFET and the output node can output a pre-driver output signal that switches between the second voltage and the first voltage. The circuit can further include a device, which is connected to receive the pre-driver output signal. The device can be, for example, a driver, a buffer, etc.

One embodiment of a circuit disclosed herein can specifically be a multi-stage wordline driver circuit. This circuit can include a voltage level shifter, which is connected to receive a first wordline select signal that switches between a first voltage and ground. The voltage level shifter can further output a pre-driver input signal that switches between a second voltage that is greater than (e.g., twice) the first voltage and ground and an inverted pre-driver input signal. The circuit can further include a pre-driver. The pre-driver can include a first input node and a second input node. The pre-driver can further include four transistors and, particularly, a first P-channel field effect transistor (PFET) with a first gate connected to the first input node, a second PFET with a second gate connected to the second input node, a third PFET, and a fourth PFET. The first PFET and the third PFET can be connected in series between a first power rail at a first voltage and a second power rail at a second voltage that is greater than (e.g., twice) the first voltage. The second PFET and the fourth PFET can also be connected in series between the first power rail and the second power rail. Furthermore, the third PFET and the fourth PFET can be cross-coupled. In this pre-driver the first input node can be connected to receive the pre-driver input signal and the second input node can be connected to receive the inverted pre-driver input signal. The pre-driver can also include an output node at a junction between the first PFET and the third PFET and the output node can output a pre-driver output signal (also referred to herein as a driver input signal) that switches between the second voltage and the first voltage. The circuit can further include a driver, which is connected to receive the pre-driver output signal (i.e., the driver input signal) and which outputs a second wordline select signal that switches between the second voltage and ground.

It should be noted that all aspects, examples, and features of disclosed embodiments mentioned in the summary above can be combined in any technically possible way. That is, two or more aspects of any of the disclosed embodiments, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The present disclosure will be better understood from the following detailed description with reference to the drawings, which are not necessarily drawn to scale and in which.

It should be noted that all aspects, examples, and features of disclosed embodiments mentioned in the summary above can be combined in any technically possible way. That is, two or more aspects of any of the disclosed embodiments, including those described in this summary section, may be combined to form implementations not specifically described herein. The details of one or more implementations are set forth in the accompanying drawings and the description below. Other features, objects and advantages will be apparent from the description and drawings, and from the claims.

DETAILED DESCRIPTION

As mentioned above, in some memory structures, a first wordline select signal received by a wordline driver circuit may be a relatively low voltage wordline select signal (WLsel-lv) (e.g., for reduced power consumption). However, for improved performance during read/write operations, it may be advantageous for the second wordline select signal output to the WL itself to be a relatively high voltage wordline select signal (WLsel-hv). Therefore, multi-stage wordline driver circuits have been developed that provide low voltage to high voltage signal conversion. These multi-stage wordline driver circuits typically include three stages. A first stage (also referred to herein as a voltage level shifter) converts a received WLsel-lv, which switches between a relatively low positive first voltage (V1) and ground (GND), to a pre-driver input signal (Pin), which switches between a relatively high positive second voltage (V2) and GND. A second stage (also referred to herein as a pre-driver) converts Pin to a driver input signal (Din), which switches between V2 and V1. A third stage (also referred to herein as a driver) converts Din to WLsel-hv, which switches between V2 and GND and which is output to the WL. However, with such multi-stage wordline driver circuits, there are often undesirable trade-offs between area, power, and performance.

For example, as mentioned above, the pre-driver of a multi-stage wordline driver circuit converts Pin to Din. To accomplish this, a conventional pre-driver includes a pair of series-connected inverters and, thus, a combination of both N-channel field effect transistors (NFETs) and P-channel field effect transistors (PFETs). The use of both NFETs and PFETs requires a significant amount of area (e.g., due to bulk spacing requirements) and also results in significant process, voltage, and temperature (PVT) variations. Furthermore, the NFETs and PFETs used include either: (a) all low voltage devices with at least some of the low voltage devices necessarily operating outside the safe operating area (SOA) (e.g., above the voltage ratings for the operating drain-source voltage (VDS), the operating gate-source voltage (VGS), or the operating gate-drain voltage (VGD)) or (b) a combination of both low voltage devices and high voltage devices with the high voltage devices being, for example, relatively large laterally double-diffused metal oxide semiconductor field effect transistors (LDMOSFETs) that have a slower switching speed.

In view of the foregoing, disclosed herein are embodiments of a novel compact high voltage pre-driver. The pre-driver can include four P-channel field effect transistors (PFETs) and, particularly, a first PFET, a second PFET, a third PFET and a fourth PFET. These PFETs can be low voltage PFETs, all with identical voltage ratings for VDS, VGS, and VGD. The first and third PFETs can be series-connected between a first power rail set at a relatively low first voltage (V1) and a second power rail at a relatively high second voltage (V2) (e.g., V2~2*V1). V1 can, for example, be set to correspond to the voltage rating for VDS, VGS, and VGD. The second and fourth PFETs can be series-connected between these two power rails. The third and fourth PFETs can be cross-coupled. The first and second PFETs can have gates connected to receive a pre-driver input signal (Pin) that switches between V2 and ground (GND) and an inverted pre-driver input signal (Pinb). The pre-driver can further include an output node at the junction between the first and third PFETs and this output node can output a pre-driver output signal (Pout) (also referred to herein as a driver input signal (Din)). Din can switch between V2 and V1. In the disclosed pre-driver, using only PFETs reduces area consumption because bulk spacing requirements between PFETs and NFETs are avoided. Furthermore, in the disclosed pre-driver, none of the low voltage PFETs operate outside the SOA (i.e., voltage ratings are not violated). Finally, the disclosed pre-driver exhibits improved performance (e.g., reduced delay, reduced static and short circuit currents, etc.) and reduced PVT variations. Also disclosed herein are embodiments of multi-stage circuits that can include the disclosed pre-driver. For example, a multi-stage wordline driver circuit can include the pre-driver between a voltage level shifter and a driver. In this case, the voltage level shifter can receive a low voltage wordline select signal (WLsel-lv), which switches between V1 and ground, and can output Pin and Pinb to the pre-driver. As mentioned above, the pre-driver can receive Pin and Pinb and output Din. The driver can receive Din and, in response, can output a high voltage wordline select signal (WLsel-hv) to a wordline and this WLsel-hv can switches between V2 and ground.

Figure 1:
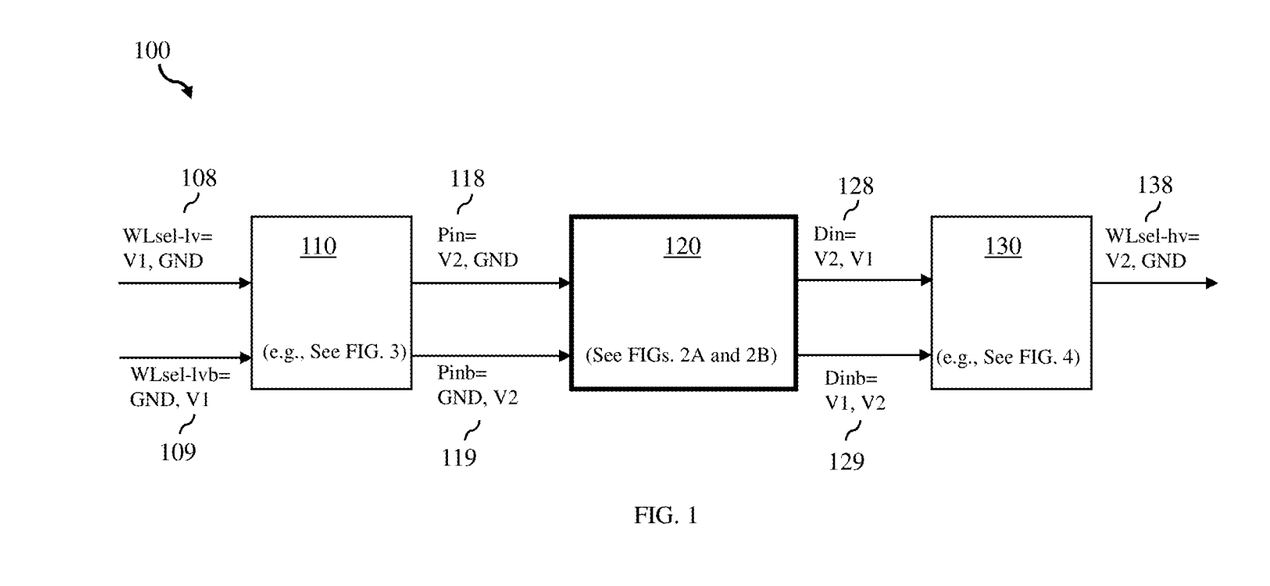
FIG. 1 is a schematic diagram illustrating a disclosed embodiment of a multi-stage wordline driver circuit.

FIG. 1 is a schematic diagram illustrating a multi-stage wordline driver circuit 100. Multi-stage wordline driver circuit 100 can include a voltage level shifter 110, a driver 130, and a novel compact high voltage pre-driver 120, which is connected to voltage level shifter 110 and to driver 130. In some embodiments, the multi-stage wordline driver circuit 100 and components thereof, including the compact high voltage pre-driver 120, can be implemented in an advanced semiconductor-on-insulator processing technology node (e.g., a fully depleted semiconductor-on-insulator processing technology node, such as a fully depleted silicon-on-insulator (FDSOI) processing technology node).

Figure 2A:
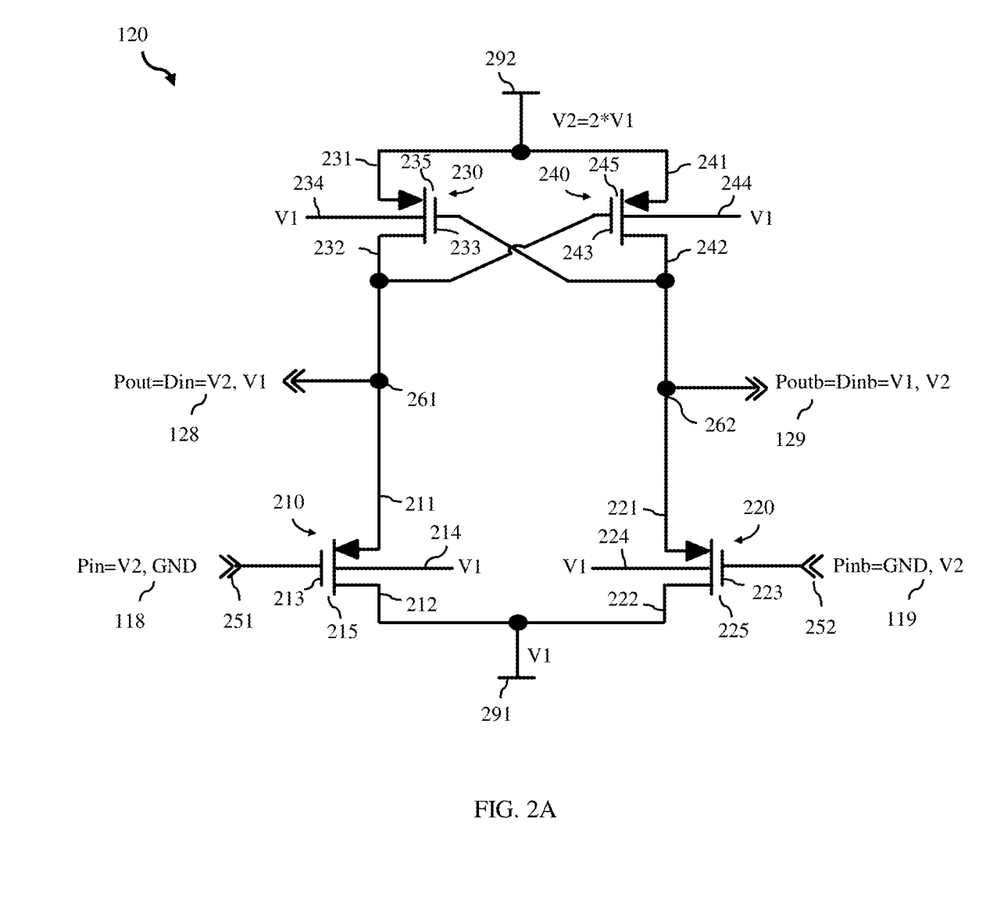
FIG. 2A is a schematic diagram illustrating a disclosed embodiment of a pre-driver that can be incorporated into the circuit of FIG. 1.
Figure 2B:
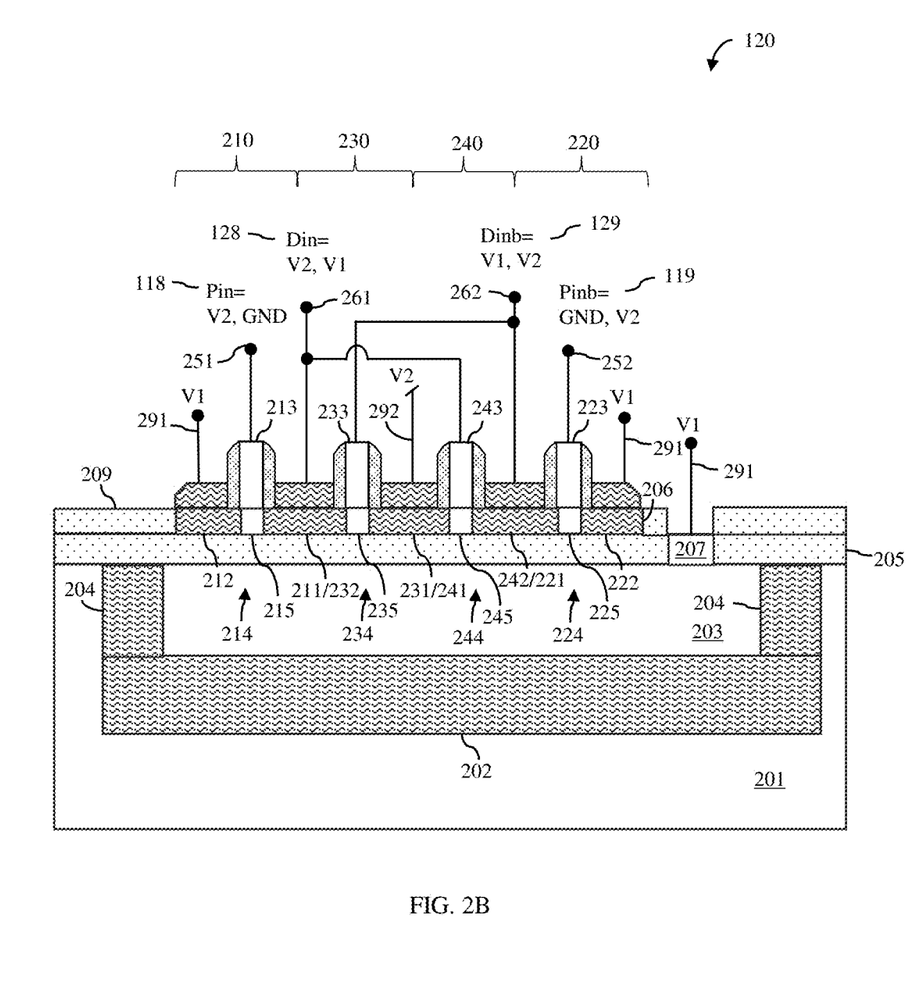
FIG. 2B is a cross-section diagram illustrating an example of the pre-driver of FIG. 2A implemented as a semiconductor-on-insulator structure.

FIG. 2A is schematic diagram illustrating, in greater detail, a disclosed embodiment of a compact high voltage pre-driver 120 (hereinafter referred to simply as pre-driver 120) that can, for example, be incorporated into the multi-stage wordline driver circuit 100 of FIG. 1. FIG. 2B is a cross-section diagram illustrating an example of pre-driver 120 implemented as semiconductor-on-insulator structure.

A semiconductor-on-insulator structure can include a semiconductor substrate 201. Semiconductor substrate 201 can be, for example, a monocrystalline silicon substrate or, alternatively, a monocrystalline substrate of any other suitable semiconductor material (e.g., silicon germanium, etc.). The semiconductor-on-insulator structure can further include an insulator layer 205 on semiconductor substrate 201. Insulator layer 205 can be, for example, a silicon dioxide layer or a layer of any other suitable insulator material. The semiconductor-on-insulator structure can further include a semiconductor layer 206 on insulator layer 205. The semiconductor layer 206 can be, for example, a monocrystalline silicon layer or a layer of any other suitable monocrystalline semiconductor material (e.g., silicon germanium, etc.).

Pre-driver 120 can be electrically connected between a first power rail 291 at a relatively low first voltage (V1) and a second power rail 292 at a relatively high second voltage (V2). V1 and V2 can both be positive voltages. Additionally, V2 can be higher than V1 and, more specifically, can be essentially double the magnitude of V1. For purposes of this disclosure, "essentially double the magnitude" refers to twice the magnitude, plus or minus 10% thereof (e.g., if V1 is 1.5V, then V2=3.0V+/−0.3V; if V1 is 1.8V, then V2=3.6V+/−0.36V; and so on).

Pre-driver 120 can further include four PFETs 210, 220, 230, 240 and, particularly, a first PFET 210, a second PFET 220, a third PFET 230 and a fourth PFET 240. First PFET 210 can include a first source region 211, a first drain region 212, a first channel region 215 between first source region 211 and first drain region 212, and a first gate 213 adjacent to first channel region 215. Second PFET 220 can include a second source region 221, a second drain region 222, a second channel region 225 between second source region 221 and second drain region 222, and a second gate 223 adjacent to second channel region 225. Third PFET 230 can include a third source region 231, a third drain region 232, a third channel region 235 between third source region 231 and third drain region 232, and a third gate 233 adjacent to third channel region 235. Fourth PFET 240 can include a fourth source region 241, a fourth drain region 242, a fourth channel region 245 between fourth source region 241 and fourth drain region 242, and a fourth gate 243 adjacent to fourth channel region 245.

Each PFET 210, 220, 230, and 240 can be a low voltage symmetric PFET. Additionally, PFETs 210, 220, 230, and 240 can have the same relatively low voltage ratings for the maximum operating VDS, the maximum operating VGS, and the maximum operating VGD. V1 can be set so that it corresponds to this relatively low voltage rating. For example, if the voltage ratings for maximum operating VDS, maximum operating VGS, and maximum operating VGD of PFETs 210, 220, 230 and 240 are all 1.8V, then V1 can also be 1.8V. In this case, V2 would be 3.6V. If the voltage ratings for maximum operating VDS, maximum operating VGS, and maximum operating VGD of PFETs 210, 220, 230 and 240 are all 1.5V, then V1 can also be 1.5V. In this case, V2 would be 3.0V, and so on. In some embodiments, first PFET 210 and second PFET 220 can have a first size and third PFET 230 and fourth PFET 240 can have second size that is different from the first size (e.g., smaller than the first size).

First PFET 210 and third PFET 230 can be series-connected between first power rail 291 and second power rail 292. That is, in first PFET 210, first drain region 212 can be electrically connected to first power rail 291 and first source region 211 can be electrically connected to third drain region 232 of third PFET 230. Additionally, in third PFET 230, third source region 231 can be electrically connected to second power rail 292. Similarly, second PFET 220 and fourth PFET 230 can be series-connected between first power rail 291 and second power rail 292. That is, in second PFET 220, second drain region 222 can be electrically connected to first power rail 291 and second source region 221 can be electrically connected to fourth drain region 242 of fourth PFET 240. Additionally, in fourth PFET 240, fourth source region 241 can be electrically connected to second power rail 292. Thus, the series-connected first and third PFETs are connected in parallel with the series-connected second and fourth PFETs. Additionally, third PFET 230 and fourth PFET 240 can be cross-coupled. That is, third gate 233 of third PFET 230 can be electrically connected to fourth drain region 242 of fourth PFET 240 and fourth gate 243 of fourth PFET 240 can be electrically connected to third drain region 232 of third PFET 230.

Pre-driver 120 can further include a first pre-driver input node 251 electrically connected to first gate 213 of first PFET 210 and a second pre-driver input node 252 electrically connected to second gate 223 of second PFET 220. First pre-driver input node 251 can be electrically connected (e.g., to one output node of a voltage level shifter 110 of a multi-stage wordline driver circuit 100, as discussed in greater detail below) to receive a pre-driver input signal (Pin) 118. Pin 118 can switch between V2 and ground (GND) (e.g., 0.0V). Second pre-driver input node 252 can be electrically connected (e.g., to another output node of voltage level shifter 110, as discussed in greater detail below) to receive an inverted pre-driver input signal (Pinb) 119. Pinb 119 can inverted with respect to Pin 118 such that, when Pin 118 switches from V2 to GND, Pinb 119 switches from GND to V2 and vice versa.

Pre-driver 120 can further include a first pre-driver output node 261 and a second pre-driver output node 262. First pre-driver output node 261 can be electrically connected to the junction between first source region 211 of first PFET 210 and third drain region 232 of third PFET 230 (and, thereby to fourth gate 243 of fourth PFET 240). First pre-driver output node 261 can output a pre-driver output signal (Pout) (also referred to in pre-driver 120 as a driver input signal (Din) 128). Din 128 can switch between V2 and V1. Second pre-driver output node 262 can be electrically connected to the junction between second source region 221 of second PFET 220 and fourth drain region 242 of fourth PFET 240 (and, thereby to third gate 233 of third PFET 230). Second pre-driver output node 262 can output an inverted pre-driver output signal (Poutd) (also referred to in pre-driver 120 as an inverted driver input signal (Dinb) 129). Dinb 129 can inverted with respect to Din 128 such that, when Din 128 switches from V2 to V1, Dinb 129 switches from V1 to V2 and vice versa.

As illustrated in FIG. 2B, in some embodiments, channel regions 215, 225, 235, 245 of PFETs 210, 220, 230, 240 can be within semiconductor layer 206 and positioned laterally between corresponding source/drain regions 211-212, 221-222, 231-232, 241-242, respectively. Source/drain regions 211-212, 221-222, 231-232, 241-242 can have P-type conductivity at a relatively high conductivity level) (e.g., can be P+ source/drain regions). Channel regions 215, 225, 235, 245 can either have N-type conductivity at a relatively low conductivity level or can be undoped (e.g., can be N− or intrinsic channel regions). As illustrated, some of the PFETs can have shared source/drain regions. For example, first source region 211 of first PFET 210 and third drain region 232 of third PFET 230 (which are series-connected and tied to first pre-driver output node 261) can be shared (e.g., within the same doped region of semiconductor layer 206). Additionally, second source region 221 of second PFET 220 and fourth drain region 242 of fourth PFET 240 (which are series-connected and tied to second pre-driver output node 262) can be shared. Finally, third source region 231 of third PFET 230 and fourth source region 241 of fourth PFET 240 (which connected in parallel to second power rail 292) can be shared.

As illustrated in FIG. 2B, each of the source/drain regions 211-212, 221-222, 231-232, 241-242 of PFETs 210, 220, 230, 240 can include a lower portion within semiconductor layer 206 and, optionally, an upper portion (e.g., a situ doped epitaxial semiconductor layer) on the top surface of semiconductor layer 206. Gates 213, 223, 233, 243 of PFETs 210, 220, 230, 240 can be above semiconductor layer 206 immediately adjacent to channel regions 215, 225, 235, 245, respectively. In some embodiments, gates 213, 223, 233, 243 can be gate-first high-K metal gate (HKMG) structures. Those skilled in the art will recognize that a gate-first HKMG structure can include, for example, a gate dielectric layer that includes: an interfacial layer (e.g., an SiO2 layer and/or an SiON layer) and a high-K gate dielectric layer on the interfacial layer. The high-K gate dielectric layer can be a layer of dielectric material with a dielectric constant that is greater than 3.9 including, for example, hafnium (Hf)-based dielectrics, such as hafnium oxide, hafnium silicon oxide, hafnium silicon oxynitride, or hafnium aluminum oxide, or other suitable high-k dielectrics, such as aluminum oxide, tantalum oxide, or zirconium oxide.

The gate-first HKMG structure can further include, for example, a gate conductor layer that includes at least: one or more stacked metal layers (e.g., a metal capping layer and an additional metal material layer suitable for dipole formation on the metal capping layer) on the high-K gate dielectric layer and an N-doped polysilicon gate conductor layer on the metal gate conductor layer(s). Alternatively, gates 213, 223, 233, 243 of PFETs 210, 220, 230, 240 can be any other suitable type of front gate structure (e.g., a gate first polysilicon gate structure, a replacement metal gate structure, etc.) used, for example, in fully depleted semiconductor-on-insulator (e.g., in FDSOI) processing technology platforms.

In any case, gate sidewall spacers can be positioned laterally adjacent to opposing sidewalls of gates 213, 223, 233, 243 and can electrically isolate the gates from adjacent source/drain regions. Gate sidewall spacers are well known in the art and, thus, the details thereof have been omitted from this specification in order to allow the reader to focus on the salient aspects of the disclosed embodiments.

Those skilled in the art will recognize that one advantage of fully depleted semiconductor-on-insulator (e.g., FDSOI) technology processing platforms is that FETs formed above insulator layer above either a well region (e.g., an Nwell or a Pwell) in order to achieve different types of NFETs or PFETs with different VTs. For purposes of this disclosure, a well region refers to a doped region of a semiconductor material. A Pwell is doped so as to have P-type conductivity, whereas an Nwell is doped so as to have N-type conductivity. For super low threshold voltage (SLVT) or low threshold voltage (LVT) devices, PFETs can be on an insulator layer aligned above a Pwell. For regular threshold voltage (RVT) or high threshold voltage (HVT) devices, PFETs can be on an insulator layer aligned above an Nwell. Whether PFETs on an insulator layer over a Pwell are SLVT or LVT devices or whether PFETs on an insulator layer over an Nwell are RVT or HVT devices will depend upon the design (e.g., device size, etc.) and process specifications (e.g., dopant concentrations, etc.). Another advantage of fully depleted semiconductor-on-insulator (e.g., FDSOI) processing technology platforms is back biasing. Specifically, in such structures, adjacent portions of the insulator layer and a well region aligned below the channel region of an FDSOI FET can effectively form a back gate. The back gate can be biased by biasing the well region to fine tune the VT. Forward back biasing (FBB) refers to back biasing that reduces VT; whereas reverse back biasing (RBB) refers to biasing that increases VT.

For purposes of illustration, FIG. 2B shows PFETs 210, 220, 230, 240 on insulator layer 205 over a Pwell 203 within semiconductor substrate 201. Thus, in this example, PFETs 210, 220, 230, 240 are either LVT or SLVT PFETs. A buried Nwell 202 can be below Pwell 203 and additional Nwells 204 can extend from the top surface of semiconductor substrate 201 to buried Nwell 202 and can laterally surround Pwell 203, thereby isolating Pwell 203. In this case, adjacent portions of insulator layer 205 and Pwell 203 aligned below each of channel regions 215, 225, 235, 245 effectively form back gates 214, 224, 234, 244 for PFETs 210, 220, 230, and 240. An isolation region 209 (e.g., a shallow trench isolation (STI) region) can extend through semiconductor layer 206 and laterally surrounds that portion of semiconductor layer 206 containing the active device regions for the PFETs 210, 220, 230, and 240. Additionally, a well tap opening can extend vertically through isolation region 209 and insulator layer 205 to Pwell 203. A Pwell tap 207 can be immediately adjacent to Pwell 203 in the well tap opening and can have P+ conductivity. Pwell tap 207 can be an in situ-doped epitaxial semiconductor layer immediately adjacent to the top surface of semiconductor substrate 201 at Pwell 203. Alternatively, Pwell tap 207 can be a shallow P+ doped region within Pwell 203. Optionally, Pwell 203 can be biased (e.g., via well tap 207) to concurrently adjust the VTs of the PFETs 210, 220, 230, and 240. For example, Pwell tap 207 can be electrically connected (e.g., via middle of the line (MOL) and back end of the line (BEOL) interconnects) to first power rail 291. Thus, back gates 214, 224, 234, 244 are concurrently back biased using V1, thereby reducing the VTs of the PFETs.

In operation, pre-driver 120 receives Pin 118 and Pinb 119 at first pre-driver input node 251 and second pre-driver input node 252, respectively. When Pin 118 is at V2 and Pinb 119 is at GND, first PFET 210 turns off and second PFET 220 turns on. As a result of second PFET 220 turning on, the voltage level at second pre-driver output node 262 is pulled down to V1 (i.e., Dinb 129 drops to V1). Additionally, since V1 at second pre-driver output node 262 is also applied to third gate 233 of third PFET 230 (because of cross-coupling), third PFET 230 turns on and the voltage level on first pre-driver output node 261 is pulled-up to V2. Thus, Din 128 rises to V2. Additionally, since V2 at first pre-driver output node 261 is applied to fourth gate 243 of fourth PFET 240 (again because of cross-coupling), fourth PFET 240 turns off and the voltage level on the second pre-driver output node 262 remains low (i.e., at V1). When Pin 118 switches to GND and Pinb 119 switches to V2, second PFET 220 turns off and first PFET 210 turns on. As a result, the voltage level at first pre-driver output node 261 is pulled down to V1. Thus, Din 128 drops to V1. Additionally, since V1 at first pre-driver output node 261 is applied to fourth gate 243 of fourth PFET 240 (because of cross-coupling), fourth PFET 240 turns on and the voltage level on the second pre-driver output node 262 is pulled-up to V2. Thus, Dinb 129 rises to V2. Additionally, since V2 at the second pre-driver output node 262 is applied to third gate 233 of third PFET 230, third PFET 230 turns off and the voltage level on the first pre-driver output node 261 remains low (i.e., at V1). Thus, at no point are VGD, VGS, or VDS of any of PFETs 210, 220, 230 or 240 greater than the voltage rating thereof or, more particularly, greater than an amount equal to the voltage rating plus some allowable amount over the voltage rating (e.g., 1.8V+0.18V=1.98V maximum limit). Furthermore, the pre-driver 120 exhibits improved performance (e.g., reduced delay, reduced static and short circuit currents, etc.) and reduced PVT variations as compared to pre-drivers with a combination of NFETs and PFETs and/or with a combination of low and high voltage devices.

As mentioned above, the disclosed compact high-voltage pre-driver 120 can be incorporated into a multi-stage wordline driver circuit. 100 between a voltage level shifter 110 and a driver 130.

Figure 3:
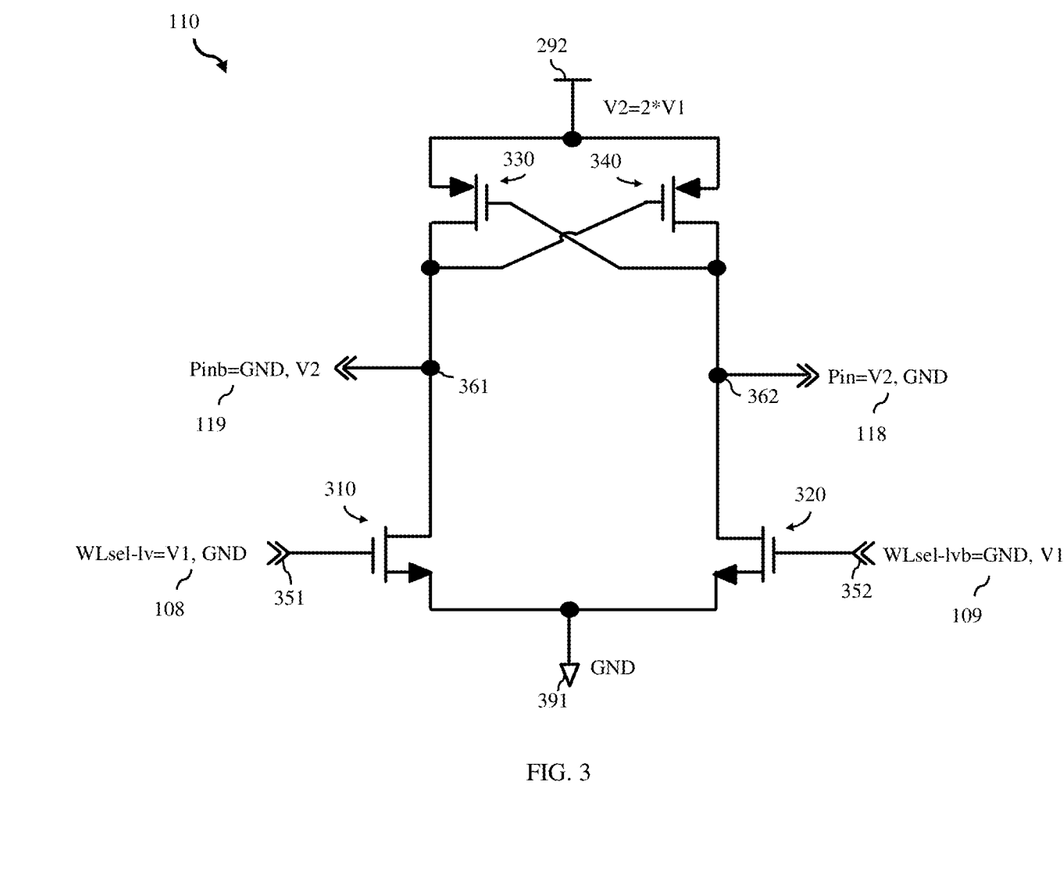
FIG. 3 is a schematic diagram illustrating an example of a voltage level shifter that can, for example, be incorporated into the circuit of FIG. 1.

Voltage level shifter 110 can be connected to receive a low voltage wordline select signal (WLsel-lv) 108, which switches between V1 and GND. Voltage level shifter 110 can further be configured to output Pin 118 (which, as mentioned above, switches between V2 and GND) and Pinb 119 (which, as mentioned above, switches between GND and V2). Voltage level shifter 110 can, for example, be connected between a ground (GND) rail 291 and second power rail 292 (which is at V2). FIG. 3 is a schematic diagram illustrating one example of such a voltage level shifter 110 that could be included in the multi-stage wordline driver circuit 100. In this example, voltage level shifter 110 can include four FETs including: NFETs 310 and 320 and PFETs 330 and 340. NFET 310 and PFET 330 can be series-connected between GND 391 and second power rail 292. Similarly, NFET 320 and PFET 340 can be series-connected between GND 391 and second power rail 292. Additionally, PFETs 330 and 340 can be cross-coupled. Voltage level shifter 110 can further include first and second voltage level shifter input nodes 351 and 352 electrically connected to the gates of NFETs 310 and 320, respectively. Voltage level shifter input node 351 can be electrically to receive a low voltage wordline select signal (WLsel-lv) 108. WLsel-lv 108 can switch between V1 and GND. Voltage level shifter input node 351 can be electrically connected to receive an inverted low voltage wordline select signal (WLsel-lvb) 109. WLsel-lvb 109 can inverted with respect to WLsel-lv 108 such that, when WLsel-lv 108 switches from V1 to GND, WLsel-lvb 109 switches from GND to V1 and vice versa. Voltage level shifter 110 can further include first and second voltage level shifter output nodes 361 and 362. First voltage level shifter output node 361 can be electrically connected to an interconnect between drain regions of NFET 310 and PFET 330 and can output Pinb 119. Second voltage level shifter output node 362 can be electrically connected to an interconnect between drain regions of NFET 320 and PFET 340 and can output Pin 118.

In operation, voltage level shifter 110 receives WLsel-lv 108 and WLsel-lv 109 at first voltage level shifter input node 351 and second voltage level shifter input node 352, respectively. When WLsel-lv 108 is at V1 and WLsel-lvb 109 is at GND, NFET 310 turns on and NFET 320 turns off. As a result of NFET 310 turning on, the voltage level at first voltage level shifter output node 361 is pulled down to GND (i.e., Pinb 119 drops to GND). Additionally, since GND at first voltage level shifter output node 361 is also applied to the gate of PFET 340 (because of cross-coupling), PFET 340 turns on and the voltage level on second voltage level shifter output node 362 is pulled-up to V2. Thus, Pin 118 rises to V2. Additionally, since V2 at second voltage level shifter output node 362 is applied to the gate of PFET 330 (again because of cross-coupling), PFET 330 turns off and the voltage level on first voltage level shifter output node 361 remains low (i.e., at GND). When WLsel-lv 108 switches to GND and WLsel-lvb 109 switches to V1, NFET 310 turns off and NFET 320 turns on. As a result, the voltage level at second voltage level shifter output node 362 is pulled down to GND. Thus, Pin 118 drops to GND. Additionally, since GND at second voltage level shifter output node 362 is applied to gate of PFET 330 (because of cross-coupling), PFET 330 turns on and the voltage level on the first voltage level shifter output node 361 is pulled-up to V2. Thus, Pinb 119 rises to V2. Additionally, since V2 at the first voltage level shifter output node 361 is applied to the gate of PFET 340, PFET 340 turns off and the voltage level on the second voltage level shifter output node 362 remains low (i.e., at GND).

Driver 130 can be connected to receive Din 128 from pre-driver 120. Driver 120 can further be configured to output a high voltage wordline select signal (WLsel-hv) 138 that, as mentioned above, switches between V2 and GND. Driver 130 can, for example, be connected between GND rail 391 and a variable power rail 492. As discussed in greater detail below, variable power rail 492 receives a variable wordline supply voltage (vVwls) 539 from a variable power supply circuit 500 and vVwls 539 that switches between V1 and V2 concurrent with Din switching from V2 to V1 and vice versa.

Figure 4:
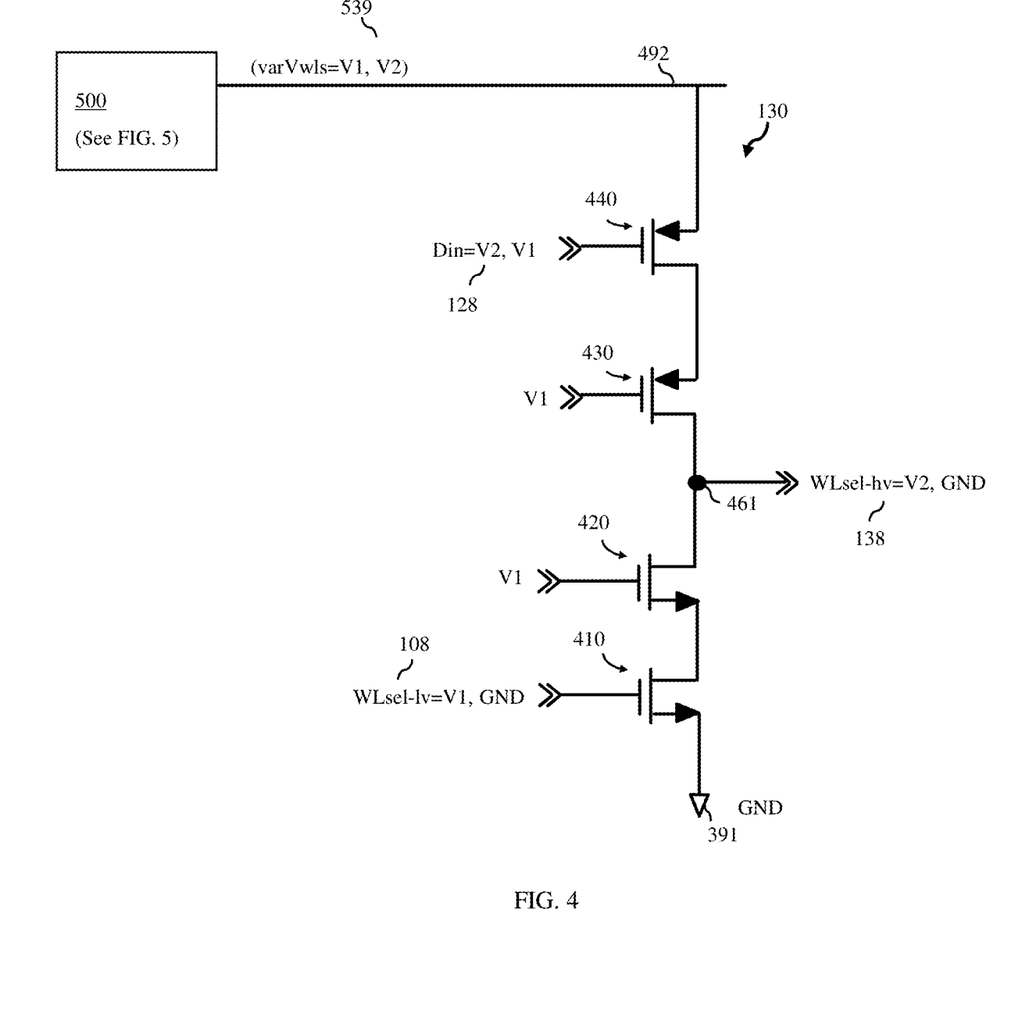
FIG. 4 is a schematic diagram illustrating an example of a driver that can, for example, be incorporated into the circuit of FIG. 1.

FIG. 4 is a schematic diagram illustrating one example of such a driver 130 that could be included in the multi-stage wordline driver circuit 100. In this example, driver 130 can include four stacked FETs including: two NFETs 410 and 420 and two PFETs 430 and 440 series-connected between GND 391 and variable power rail 492. Gate of PFET 440 can receive Din 128 (which switches between V2 and V1) as an input. Gates of PFET 430 and NFET 420 can be continuously biased with V1 (e.g., tied to the first power rail). The gate of NFET 410 can be connected to receive WLsel-lv 108 (which, as mentioned above, switches between V1 and GND). Driver 130 can further have a driver output node 461 connected to an interconnect between NFET 420 and PFET 430. Driver output node 461 can output WLsel-hv 138 (which, as mentioned above, switches between V2 and GND).

Figure 5:
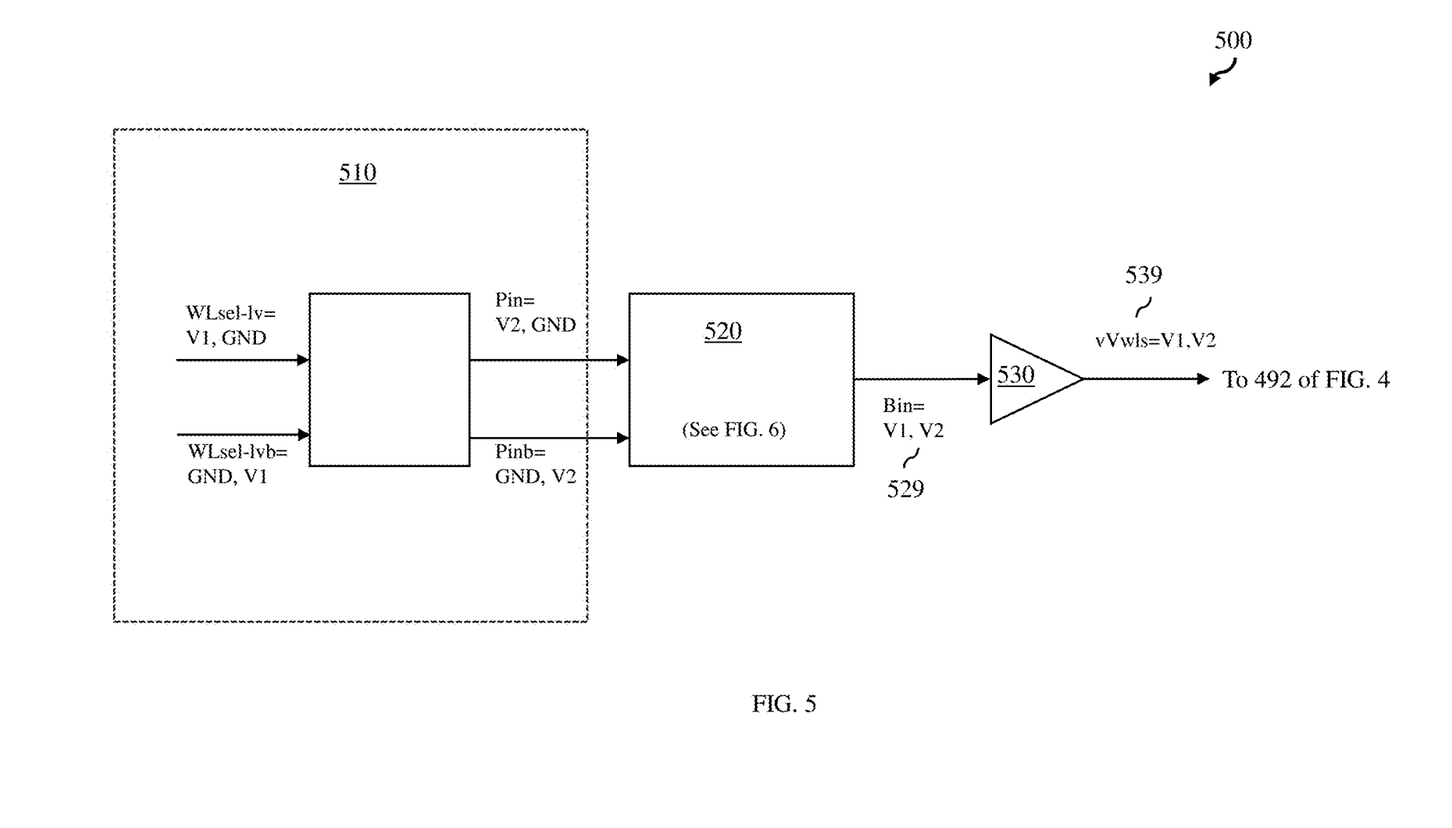
FIG. 5 is a schematic diagram illustrating a disclosed embodiment of a multi-stage variable power supply circuit.

As mentioned above, vVwls 539 on variable power rail 492 is supplied by a variable power supply circuit 500. FIG. 5 is a schematic diagram illustrating an example of such a variable power supply circuit 500. In this example, variable power supply circuit 500 is a multi-stage variable power supply circuit and, like the multi-stage wordline driver circuit 100 of FIG. 1, it may include a compact high voltage pre-driver 520, as disclosed herein. That is, this multi-stage variable power supply circuit 500 includes a voltage level shifter 510, a buffer 530, and a novel compact high voltage pre-driver 520 connected to voltage level shifter 510 and to buffer 530. Multi-stage variable power supply circuit 500 and components thereof can be implemented in an advanced semiconductor-on-insulator processing technology node (e.g., a fully depleted semiconductor-on-insulator processing technology node, such as a fully depleted silicon-on-insulator (FDSOI) processing technology node).

Figure 6:
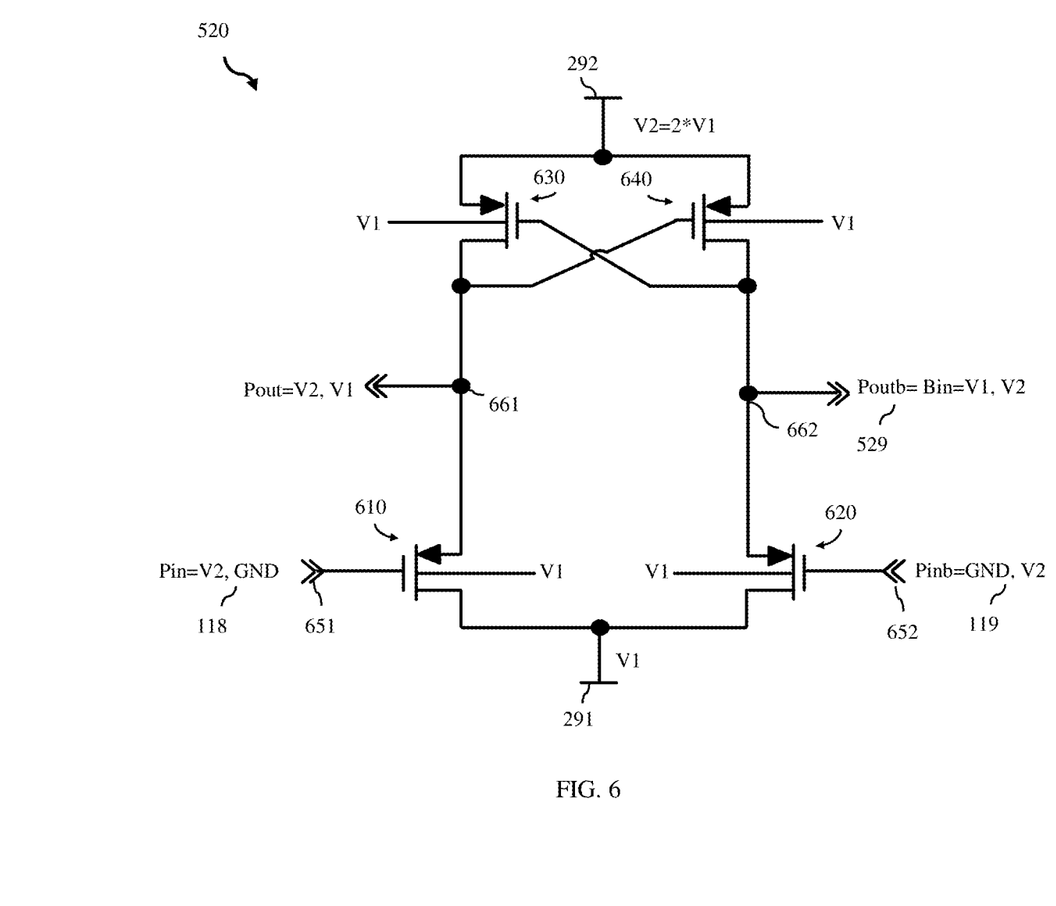
FIG. 6 is a schematic diagram illustrating a disclosed embodiment of a pre-driver that can be incorporated into the circuit of FIG. 5.

It should be noted that the same voltage level shifter 110/510 can be shared by multi-stage wordline driver circuit 100 and multi-stage variable power supply circuit 500. In this case, the same Pin 118 (which switches between V2 and GND) and the same Pinb 119 (which switches between GND and V2) will be output from the voltage level shifter to both pre-driver 120 of multi-stage wordline driver circuit 100 and pre-driver 520 of multi-stage variable power supply circuit 500. Alternatively, discrete voltage level shifters 110 and 510 can be employed in circuits 100 and 500. In this case, voltage level shifters 110, 510 can have the same configuration (e.g., as described above and illustrated in FIG. 3), can have the same input signals WLsel-lv and WLsel-lvb (also as described above) and, in response to those input signals, can each output separate Pin and Pinb signals. Pre-driver 520 of multi-stage variable power supply circuit 500 can have the same configuration as pre-driver 120 of multi-stage wordline driver circuit 100, described in detail above and illustrated in FIG. 2A). Specifically, FIG. 6 is a schematic diagram illustrating pre-driver 520 and, like pre-driver 120, pre-driver 520 is electrically connected between first power rail 291 (which as mentioned above is at the relatively low first voltage (V1)) and second power rail 292 (which as mentioned above is at the relatively high second voltage (V2)).

Pre-driver 520 includes four PFETs 610, 620, 630, 640 and, particularly, a first PFET 610, a second PFET 620, a third PFET 630 and a fourth PFET 640. Each PFET 610, 620, 630, and 640 is a low voltage symmetric PFET. Additionally, PFETs 610, 620, 630, and 640 can have the same relatively low voltage ratings for the maximum operating VDS, the maximum operating VGS, and the maximum operating VGD. First PFET 610 and third PFET 630 are series-connected between first power rail 291 and second power rail 292. Similarly, second PFET 620 and fourth PFET 640 are series-connected between first power rail 291 and second power rail 292. Additionally, third PFET 630 and fourth PFET 640 are cross-coupled. That is, the gate of third PFET 630 is electrically connected to the drain region of fourth PFET 640 and the gate of fourth PFET 640 is electrically connected to the drain region of third PFET 630.

Pre-driver 520 further includes pre-driver input nodes 651 and 652 electrically connected to receive Pin and Pinb and to apply Pin and Pinb to gates of the first and second PFETs 610 and 620, respectively. As mentioned above, Pin switches between V2 and GND and Pinb is inverted with respect to Pin such that, when Pin switches from V2 to GND, Pinb switches from GND to V2 and vice versa. Pre-driver 520 further includes pre-driver output nodes 661 and 662 at junctions between first PFET 610 and third PFET 630 and between second PFET 620 and fourth PFET 640, respectively. Pre-driver output node 661 outputs a pre-driver output signal (Pout) that switches between V2 and V1. Pre-driver output node 662 outputs an inverted pre-driver output signal (Poutb). In the case of the variable power supply circuit 500, Poutb can also be referred to as buffer input signal (Bin) 529. Bin 529 can be inverted with respect to Pout such that, when Pout switches from V2 to V1, Bin 529 switches from V1 to V2 and vice versa.

Operation of pre-driver 520 within multi-stage variable power supply circuit 500 can be essentially the same as that described in detail above with regard to operation of pre-driver 120 within multi-stage wordline driver circuit 100. Thus, within pre-driver 520, none of the low voltage PFETs operate outside the SOA (i.e., voltage ratings are not violated) and pre-driver 520 similarly exhibits improved performance (e.g., reduced delay, reduced static and short circuit currents, etc.) and reduced PVT variations.

Buffer 530 can receive Bin 529 and can output vVwls 539 to the variable power rail 492. vVwls 539, like Bin 529, can switch between V1 and V2 concurrent with Din switching from V2 to V1 and vice versa. As with conventional buffers, buffer 530 effectively connects a high-impedance source with a low-impedance load without significant attenuation or signal distortion. Referring again to FIG. 4 and, particularly, to the detailed schematic drawing of driver 130 of multi-stage wordline driver circuit 100.

In operation, when driver 130 is selected, vVwls 539 on variable power rail 492 will switch to V2 and Din on the gate of PFET 440 will switch to V1. Thus, VSG of PFET 440 will be V2−V1>VTH such that PFET 440 turns on. As a result of PFET 440 turning on, the voltage level at the drain of PFET 430 and thereby at the source of PFET 430 will be pulled up to V2. With V1 applied to the gate of PFET 430, VSG of PFET 430 will be V2−V1>VTH such that PFET 430 also turns on. As a result of PFETs 440 and 430 turning on, the voltage level at driver output node 461 will be pulled up to V2 such that WLsel-hv 138 is at V2. Concurrently, WLsel-lv 108 applied to the gate of NFET 410 will be at GND. Thus, VGS of NFET 410 will be at GND−GND=0V<VTH such that NFET 410 turns off. As a result of NFET 410 turning off, the drain of NFET 410 will be floating. With V1 applied to the gate of NFET 420, the source of NFET 420 and the drain of NFET 410 will settle at V1 (i.e., at the gate voltage of NFET 420).

When driver 130 is unselected, vVwls 539 on variable power rail 492 could be at either V2 or V1.

Specifically, when driver 130 is unselected, vVwls 539 is at V2 and Din 128 on the gate of PFET 440 is at V2, VSG of PFET 440 will be at V2−V2=0V<VTH such that PFET 440 turns off. As a result of PFET 440 turning off, the drain of PFET 440 will be floating. With V1 applied to the gate of PFET 430, the source of PFET 430 and the drain of PFET 440 will settle at V1 (i.e., at the gate voltage of PFET 430). Concurrently, WLsel-lv 108 applied to the gate of NFET 410 will be at V1. Thus, VGS of NFET 410 will be V1−GND>VTH such that NFET 410 turns on. As a result of NFET 410 turning on, the voltage at the drain of NMOS 410 will be pulled down to GND. With V1 applied to the gate of NFET 420, VGS of NFET 420 will be V1−GND>VTH, such that NFET 420 turns on. As a result of NFETs 410 and 420 turning on, the voltage level at driver output node 461 is pulled down to GND.

When driver 130 is unselected, vVwls 539 is at V1, and Din 128 on the gate of PFET 440 is at V2, VSG of PFET 440 is V1−V2<VTH such that PFET 440 turns off. As a result of PFET 440 turning off, the drain of PFET 440 will be floating. With V1 applied to the gate of PFET 430, the source of PFET 430 and drain of PFET 440 will settle at V1 (i.e., at the gate voltage of PFET 430). Concurrently, WLsel-lv 108 applied to the gate of NFET 410 will be at V1. Thus, VGS of NFET 410 will be V1−GND>VTH such that NFET 410 turns on. As a result of NFET 410 turning on, the voltage at the drain of NFET 410 is pulled down to GND. With V1 applied to the gate of NFET 420, VGS of NFET 420 will be at V1−GND>VTH such that NFET 420 turns on. As a result of NFETs 410 and 420 turning on, the voltage level at driver output node 461 is pulled down to GND.

When driver 130 is unselected, vVwls 539 is at V1, and Din 128 on the gate of PFET 440 is at V1, VSG of PFET 440 is V1−V1=0V<VTH such that PFET 440 turns off. As a result of PFET 440 turning off, the drain of PFET 440 will be floating. With V1 applied to the gate of PFET 430, the source of PFET 430 and the drain of PFET 440 will settle at V1 (i.e., at the gate voltage of PFET 430). Concurrently, WLsel-lv 108 applied to the gate of NFET 410 will be at V1. Thus, VGS of NFET 410 will be V1−GND>VTH such that NFET 410 turns on. As a result of NFET 410 turning on, the voltage at the drain of NFET 410 will be pulled down to GND. With V1 applied to the gate of NFET 420, VGS of NFET 420 will be V1−GND>VTH such that NFET 420 turns on. Again, as a result of NFETs 410 and 420 turning on, the voltage level at driver output node 461 is pulled down to GND.

The voltage level shifter and driver examples provided in FIGS. 3 and 4 and described above are provided for illustration purposes and are not intended to be limiting. Alternatively, any other suitable voltage level shifter 110 and/or driver 130 could be included in the multi-stage wordline driver circuit 100 of FIG. 1 in addition to pre-driver 120 (as shown in FIG. 2A).

Figure 7:
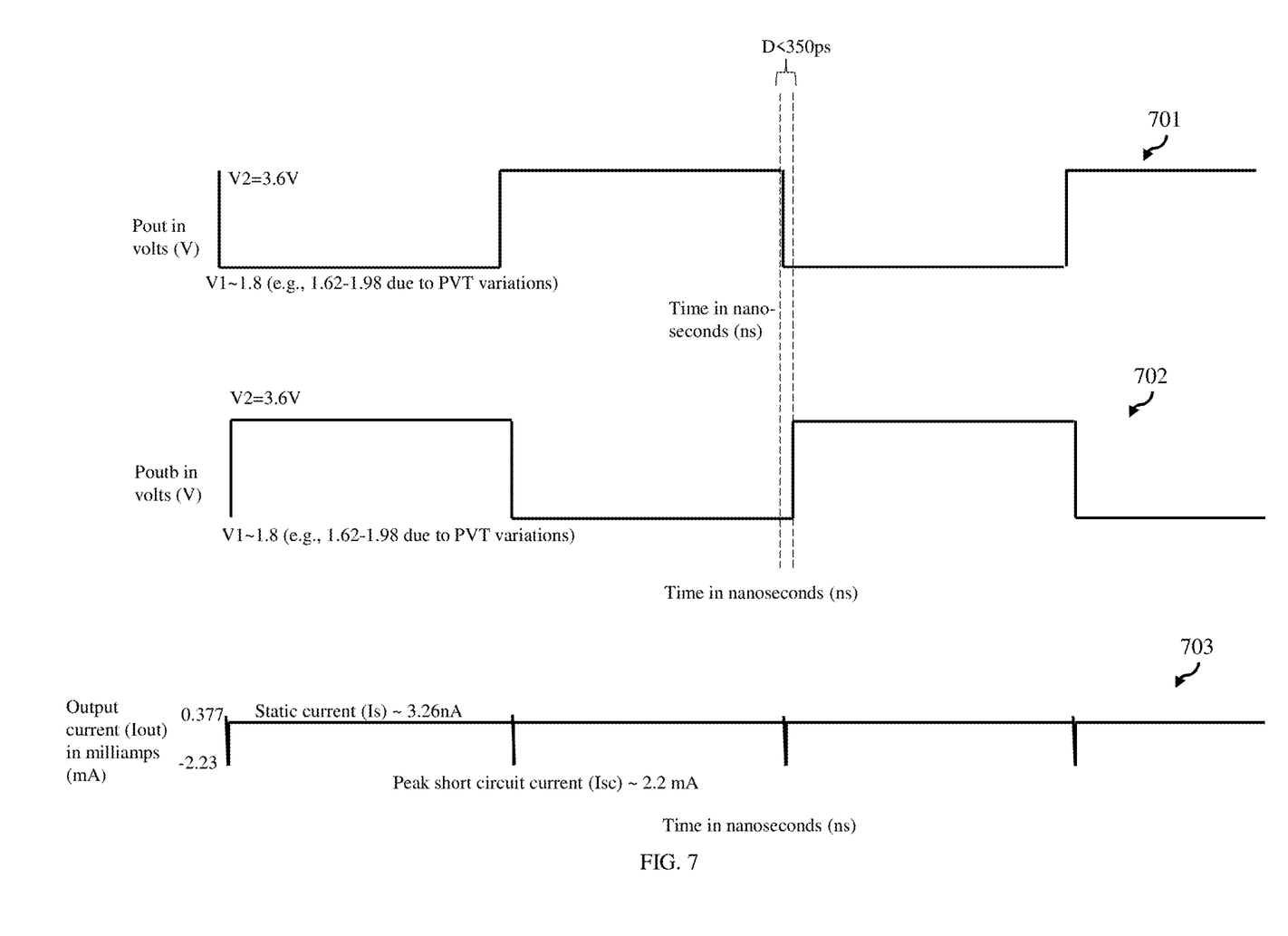
FIG. 7 is a graph illustrating pre-driver performance in an example implementation.

FIG. 7 is a graph including curves 701, 702 and 703 representing Pout, Poutb, and output current, respectively, over time for the disclosed compact high-voltage pre-driver (e.g., pre-driver 120 or pre-driver 520). As illustrated, V1 of Pout and Poutb are at approximately 1.8 with only minimal PVT variations (i.e., V1 may range from 1.62V-1.98V). Furthermore, the delay between switching of Pout and switching of Poutb is relatively small and reduced as compared to prior art pre-drivers. For example, delay (D) between Pout and Poutb in the disclosed pre-driver can be less than 350 picoseconds (ps), such as at 321 ps, whereas D between Pout and Poutb of prior art pr-drivers is typically over 550 ps (e.g., 566 ps). Also, static current (Is) and peak short circuit current (Isc) (i.e., the maximum possible instantaneous value of a short circuit current) of Iout are relatively small and reduced as compared to prior art pre-drivers. For example, as illustrated, Is is approximately 3.26 nA and Isc is approximately 2.2 mA, whereas Is and Isc in prior art pre-drivers are typically over 15 nA (e.g., 15.7 nA) and over 13 mA (e.g., 13.3 mA), respectively. Thus, the disclosed compact high-voltage pre-driver exhibits reduced power consumption as compared to prior art pre-drivers. It should be noted that the multi-stage wordline driver circuit 100 of FIG. 1 and the multi-stage variable power supply circuit 500 of FIG. 5 are just two examples of circuits that can incorporate a compact high voltage pre-driver as disclosed herein. Alternatively, any other circuit requiring a pre-driver could similarly incorporate the disclosed compact high-voltage pre-driver.

In the method and structures described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped with a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

It should be understood that the terminology used herein is for the purpose of describing the disclosed structures and methods and is not intended to be limiting. For example, as used herein, the singular forms "a," "an," and "the" are intended to include the plural forms as well, unless the context clearly indicates otherwise. Additionally, as used herein, the terms "comprises," "comprising," "includes," and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a first input node;
    a second input node; and
    four transistors including: a first P-channel field effect transistor (PFET) with a first gate connected to the first input node; a second PFET with a second gate connected to the second input node; a third PFET; and a fourth PFET,
    wherein the first PFET and the third PFET are connected in series between a first power rail at a first voltage and a second power rail at a second voltage greater than the first voltage,
    wherein the second PFET and the fourth PFET are connected in series between the first power rail and the second power rail,
    wherein the third PFET and the fourth PFET are cross-coupled,
    wherein the first input node is connected to receive a pre-driver input signal that switches between the second voltage and ground,
    wherein the second input node is connected to receive an inverted pre-driver input signal, and
    wherein the four transistors have back gates including adjacent portions of an insulator layer and a well region in a semiconductor substrate below the insulator layer and wherein the well region is biased at the first voltage.

2. The structure of claim 1, further comprising an output node at a junction between the first PFET and the third PFET, wherein the output node outputs a pre-driver output signal that switches between the second voltage and the first voltage.

3. The structure of claim 1, wherein the four transistors have identical voltage ratings for an operating gate-source voltage, an operating gate-drain voltage, and an operating source-drain voltage.

4. The structure of claim 3, wherein the first voltage is set based on the voltage ratings.

5. The structure of claim 4, wherein the second voltage is twice the first voltage.

6. The structure of claim 4, wherein the first voltage is 1.8V and the second voltage is 3.6V.

7. The structure of claim 1, wherein the first PFET and the second PFET have a first size and wherein the third PFET and the fourth PFET have a second size that is smaller than the first size.

8. A structure comprising:
    a voltage level shifter connected to receive a voltage level shifter input signal that switches between a first voltage and ground, wherein the voltage level shifter outputs a pre-driver input signal that switches between a second voltage that is greater than the first voltage and ground and further outputs an inverted pre-driver input signal;
    a pre-driver including:
        a first input node;
        a second input node;
        four transistors including: a first P-channel field effect transistor (PFET) with a first gate connected to the first input node; a second PFET with a second gate connected to the second input node; a third PFET; and a fourth PFET,
            wherein the first PFET and the third PFET are connected in series between a first power rail at a first voltage and a second power rail at a second voltage greater than the first voltage,
            wherein the second PFET and the fourth PFET are connected in series between the first power rail and the second power rail,
            wherein the third PFET and the fourth PFET are cross-coupled,
            wherein the first input node is connected to receive the pre-driver input signal, and
            wherein the second input node is connected to receive the inverted pre-driver input signal;
        an output node at a junction between the first PFET and the third PFET, wherein the output node outputs a pre-driver output signal that switches between the second voltage and the first voltage; and
    a device connected to receive the pre-driver output signal,
    wherein the four transistors have back gates adjacent portions of an insulator layer and a well region in a substrate below the insulator layer and wherein the well region is biased at the first voltage.

9. The structure of claim 8, wherein the device is a driver and wherein the driver outputs a wordline select signal that switches between the second voltage and ground.

10. The structure of claim 8, wherein the device is a buffer.

11. The structure of claim 8, wherein the four transistors have identical voltage ratings for an operating gate-source voltage, an operating gate-drain voltage, and an operating source-drain voltage and the first voltage is set based on the voltage ratings.

12. The structure of claim 8, wherein the second voltage is twice the first voltage.

13. The structure of claim 8, wherein the first PFET and the second PFET have a first size, and wherein the third PFET and the fourth PFET have a second size that is smaller than the first size.

14. A structure comprising:
a voltage level shifter connected to receive a first wordline select signal that switches between a first voltage and ground, wherein the voltage level shifter outputs a pre-driver input signal that switches between a second voltage that is greater than the first voltage and ground and further outputs an inverted pre-driver input signal;
a pre-driver including:
  a first input node;
  a second input node;
  four transistors including: a first P-channel field effect transistor (PFET) with a first gate connected to the first input node; a second PFET with a second gate connected to the second input node; a third PFET; and a fourth PFET,
    wherein the first PFET and the third PFET are connected in series between a first power rail at the first voltage and a second power rail at the second voltage,
    wherein the second PFET and the fourth PFET are connected in series between the first power rail and the second power rail,
    wherein the third PFET and the fourth PFET are cross-coupled, and
    wherein the first input node is connected to receive the pre-driver input signal, and
    wherein the second input node is connected to receive the inverted pre-driver input signal;
  an output node at a junction between the first PFET and the third PFET, wherein the output node outputs a driver input signal that switches between the second voltage and the first voltage; and
a driver connected to receive the driver input signal, wherein the driver outputs a second wordline select signal that switches between the second voltage and ground,
wherein the four transistors have back gates including portions of an insulator layer and of a well region in a semiconductor substrate below the insulator layer and wherein the well region is biased at the first voltage.

15. The structure of claim 14, wherein the four transistors have identical voltage ratings for an operating gate-source voltage, an operating gate-drain voltage, and an operating source-drain voltage and wherein the first voltage is set based on the voltage ratings.

16. The structure of claim 14, wherein the second voltage is twice the first voltage.

17. The structure of claim 14, wherein the first PFET and the second PFET have a first size and wherein the third PFET and the fourth PFET have a second size that is smaller than the first size.

* * * * *